United States Patent
Johnson et al.

(10) Patent No.: US 8,148,984 B2
(45) Date of Patent: Apr. 3, 2012

(54) METHOD FOR MAGNITUDE CONSTRAINED PHASE CONTRAST MAGNETIC RESONANCE IMAGING

(75) Inventors: Kevin M Johnson, Madison, WI (US); Alexey A Samsonov, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 361 days.

(21) Appl. No.: 12/573,508

(22) Filed: Oct. 5, 2009

(65) Prior Publication Data
US 2010/0085052 A1  Apr. 8, 2010

Related U.S. Application Data

(60) Provisional application No. 61/102,712, filed on Oct. 3, 2008.

(51) Int. Cl.
*G01V 3/00* (2006.01)
(52) U.S. Cl. .................................................. 324/309
(58) Field of Classification Search .......... 324/300–322; 600/407–445
See application file for complete search history.

(56) References Cited

U.S. PATENT DOCUMENTS

| | | | |
|---|---|---|---|
| 6,064,208 A | 5/2000 | Steckner | |
| 6,188,922 B1 * | 2/2001 | Mistretta et al. | 600/419 |
| 6,288,541 B1 * | 9/2001 | Dumoulin | 324/306 |
| 6,487,435 B2 * | 11/2002 | Mistretta et al. | 600/420 |
| 7,049,816 B2 * | 5/2006 | Mistretta et al. | 324/306 |
| 7,176,683 B2 | 2/2007 | Reeder et al. | |
| 7,711,166 B2 * | 5/2010 | Mistretta et al. | 382/128 |

OTHER PUBLICATIONS

Samsonov, et al., Nonlinear Magnitude-Constrained Estimation of Image Phase for Accelerated Flow Imaging, Proc. Intl. Soc. Mag. Reson. Med. 15 (2007) p. 149.

* cited by examiner

*Primary Examiner* — Brij Shrivastav
(74) *Attorney, Agent, or Firm* — Quarles & Brady LLP (57) ABSTRACT

A method for magnitude constrained phase contrast magnetic resonance imaging (MRI) is provided. The method utilizes an assumption that the image magnitude is shared across a series of images reconstructed from a set of phase contrast enhanced k-space data. In this manner, one common magnitude image and a plurality of phase images are reconstructed substantially contemporaneously from the acquired image data. The method is further applicable to other phase contrast MRI methods, such as phase contract velocimetry. Moreover, simultaneous phase contrast velocimetry and chemical shift imaging, in which water and fat signal separation is achieved, is provided.

17 Claims, 5 Drawing Sheets

METHOD FOR MAGNITUDE CONSTRAINED PHASE CONTRAST MAGNETIC RESONANCE IMAGING

CROSS-REFERENCE TO RELATED APPLICATIONS

This application claims the benefit of U.S. Provisional Patent Application Ser. No. 61/102,712 filed on Oct. 3, 2008, and entitled "Method for Magnitude Constrained Phase Contrast Magnetic Resonance Imaging."

STATEMENT REGARDING FEDERALLY SPONSORED RESEARCH

This invention was made with United States government support awarded by the following agency: NIH CA116380. The United States government has certain rights in this invention.

BACKGROUND OF THE INVENTION

The field of the invention is magnetic resonance imaging ("MRI") methods and systems. More particularly, the invention relates to methods and systems for phase contrast MRI.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

MR methods have been developed that encode spin motion into the phase of the acquired signal. These form a class of techniques known as phase contrast ("PC") MRI methods. Currently, most PC techniques acquire two images, with each image having a different sensitivity to the same velocity component. Images may then be produced by forming either the phase difference or complex difference between the pair of velocity-encoded images. This motion encoding method is used to image flowing blood in what is commonly referred to as phase contrast magnetic resonance angiography ("PC-MRA").

Phase contrast techniques such as that described in U.S. Pat. No. 6,954,067 have also been used to image flow and provide quantitative measurement of blood flow. In flow imaging the motion encoding gradients used during the scan are sensitive to velocity components in two or three orthogonal directions. From the resulting velocity component images, total quantitative flow images can be produced.

Phase contrast MRI often utilizes a plurality of acquired image datasets, from which reconstructed image magnitudes often highly correlate. In conventional PC image reconstruction techniques, individual magnitude and phase images are reconstructed first. Then, the reconstructed images are processed to produce both averaged image magnitudes and quantitative parameters from the phase images.

Phase contrast velocimetry MRI can be utilized to provide both quantitative velocity and anatomical information. Velocity information is of particular interest as it can be processed to yield diagnostic measures not generally available from standard contrast developed from spin relaxation. In vascular imaging, PC velocity data can be utilized to determine abnormal flow rates, determine vessel wall compliance, and observe abnormal flow dynamics. Additionally, velocity data can be processed to determine hemodynamic parameters such as wall shear stress and relative pressure. Accurate quantification of velocity fields and parameters derived from those fields often requires images that simultaneously have high temporal and spatial resolution, which is difficult to achieve due to the scan time increase from multiple measurements required for velocity encoding.

Stronger, faster imaging gradients can be utilized to provide limited acceleration to PC scan sessions; however, the acceleration comes at the cost of increased eddy-current artifacts, reduced signal-to-noise ratio ("SNR"), and reduced data acquisition efficiency. Improved acquisition efficiency at high bandwidth can be gained by employing non-Cartesian sampling patterns, such as spiral and radial acquisition schemed. These acquisitions can be used to maintain a similar readout gradient duration as lower bandwidth Cartesian acquisitions, whose length is ultimately limited by $T^*_2$ decay, and simultaneously covering more k-space per unit time. These techniques open up the possibility of clinical applications of PC that would not be generally practical, such as real-time 2D or 3D PC MRI.

However, the utilization of phase contrast in areas with significant fat signal surrounding vessels presents a unique set of challenges. In these vessels, chemical shift artifacts can cause fat signal to interfere with neighboring water signal, thereby reducing the accuracy of velocity measurements within those voxels. This problem is especially true when phase contrast is used in conjunction with non-Cartesian trajectories at high field. Unfortunately, limited options are available for reliable fat suppression with phase contrast. Traditional fat-suppression pulses may increase specific absorption rate ("SAR"), reduce available data acquisition time, and suffer from sensitivity to off-resonance effects caused by heterogeneity of the main magnetic field. Selective water excitation can also be utilized; however, in addition to off-resonance sensitivity, these pulses are sensitive to flow artifacts.

Chemical shift imaging ("CSI") techniques, which acquire images at multiple echo times and utilize the complex signal to separate water and fat, are not sensitive to off-resonance and can produce images with optimal SNR. These techniques can be utilized in conjunction with almost any imaging method, including phase contrast velocimetry; however, they come at the cost of a three-fold increase in the number of measurements required. For interleaved velocity encoding, this also leads to a three-fold increase in the minimum temporal resolution, which is already hampered by the several fold acquisition overhead of phase contrast imaging. The three-fold scan time increase is forced due to the separation of chemical shift imaging from velocity encoding.

It would therefore be desirable to provide a method for phase contrast magnetic resonance imaging that circumvents the need to perform several image reconstructions in order to produce phase images. Moreover, it would be desirable to provide a method for phase contrast velocimetry that further allows for the mitigation of off-resonance and other imaging artifacts without undue burden to the image reconstruction process.

SUMMARY OF THE INVENTION

The present invention overcome the foregoing problems and setbacks by providing a method for magnitude constrained image reconstruction in phase contrast magnetic resonance imaging ("MRI"), in which one common magnitude image and a plurality of phase images are estimated directly from at least one of partially sampled and undersampled MRI datasets. The correlation between image magnitudes of individual datasets serves as a basis for designing a new family of MRI data reconstruction techniques that are beneficial not only for accelerated imaging techniques in general, but also in the regularization of existing techniques such as parallel MRI.

It is an aspect of the present invention to provide a method for reconstructing high resolution angiographic velocity images that employs non-Cartesian data acquisition schemes. Such a method creates a tradeoff between image artifacts from off-resonance effects and aliasing artifacts from fat. Particularly in body imaging, fat content can cause degraded image quality, create errors in the velocity measurements, and prevent the use of self-calibrated $B_0$ inhomogeneity field maps. The influence of fat is reduced and self-calibrated $B_0$ inhomogeneity corrections are facilitated by employing a combination of chemical shift imaging with phase contrast velocimetry with non-linear least squares estimation of velocity, fat, and water signals.

It is another aspect of the invention to provide a method that enables fat-water separation and chemical shift error elimination in phase contrast MRI with substantially fewer measurements. To reconstruct these images, a non-linear estimation that corrects for off-resonance distortions caused by main field inhomogeneity is provided. This reconstruction also substantially simultaneously provides fat-water separation for improved velocity measurement accuracy.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
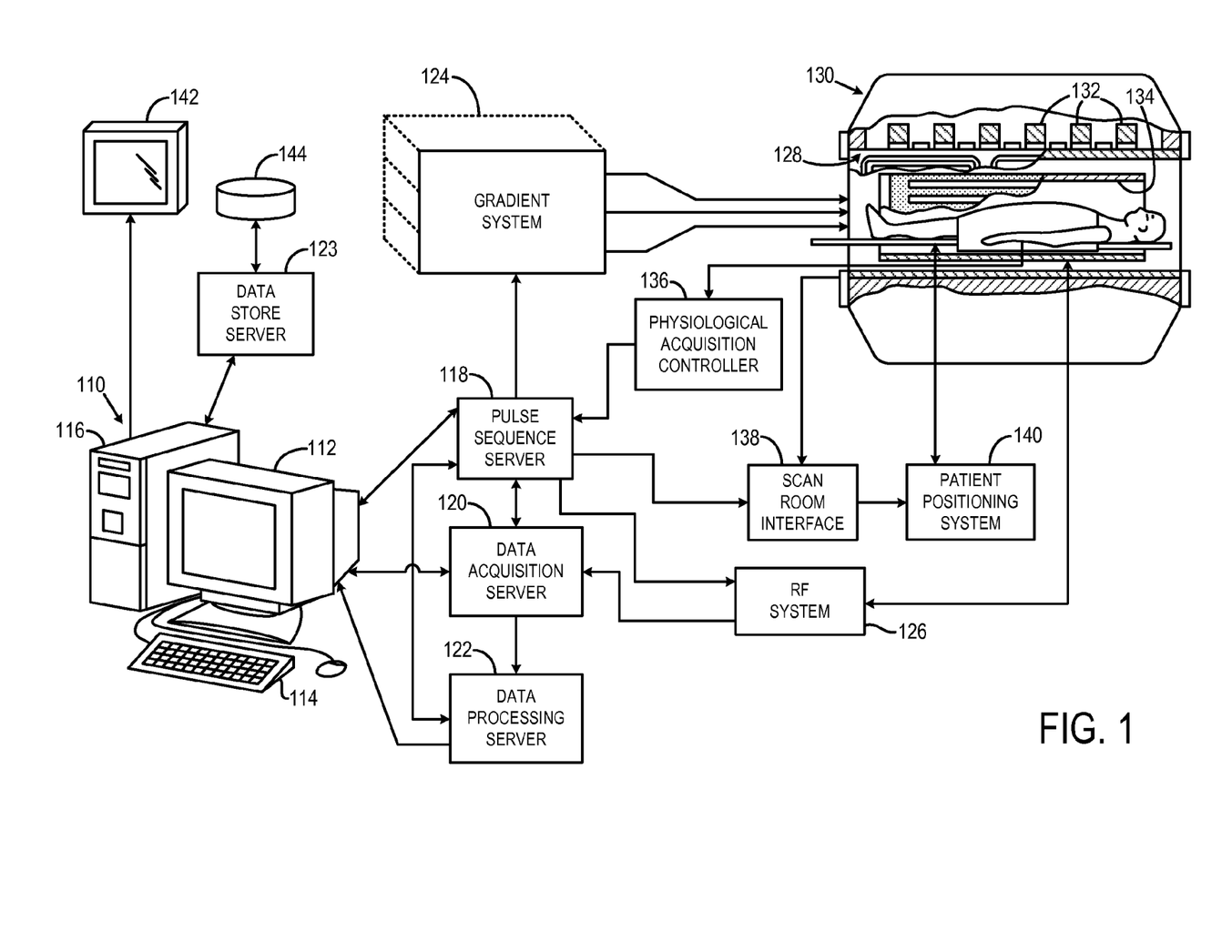
FIG. 1 is a block diagram of an MRI system that employs the present invention.

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radio frequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 2:
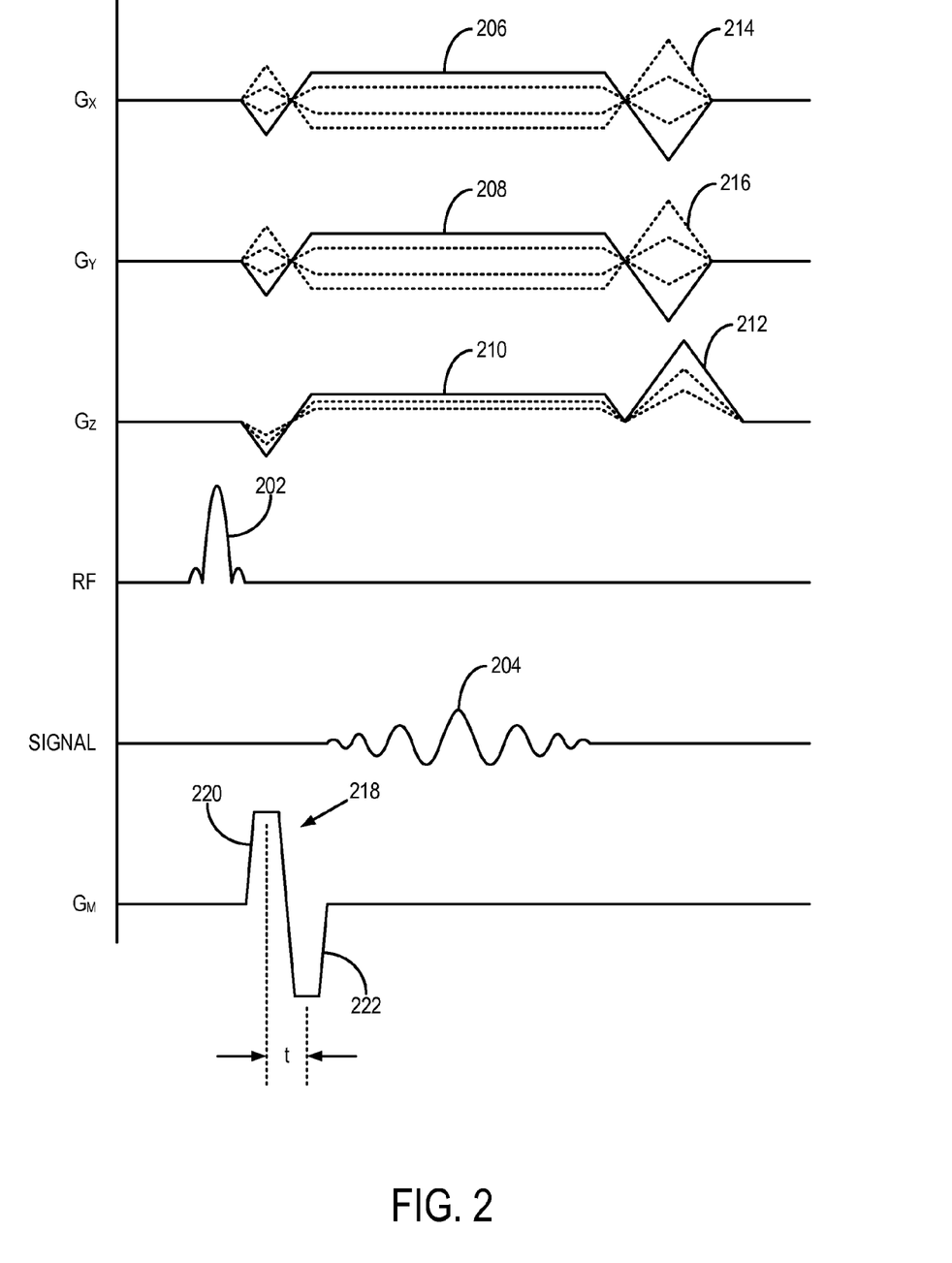
FIG. 2 is a graphic representation of an exemplary pulse sequence employed by the MRI system of FIG. 1 when practicing the present invention.

An exemplary pulse sequence used to acquire data as 3D projections is shown in FIG. 2. Full-echo, partial-echo, and multiple-echo, such as dual-echo, readouts can be performed during data acquisition. If partial-echo is chosen, the bottom half of k-space ($k_z<0$) is only partially sampled. If dual-echo is chosen, a bipolar readout gradient is employed, as will be described below in detail. Because of the large field-of-view ("FOV") in all directions, a non-selective radio frequency ("RF") pulse 202 is used to produce transverse magnetization throughout the image FOV.

A gradient-recalled magnetic resonance ("MR") echo signal 204 is produced by spins in the excited FOV and sampled in the presence of three readout gradients 206, 208, and 210 to acquire image data. Since a slab-select gradient is not required, the readout gradient waveforms $G_x$, $G_y$, and $G_z$ have a similar form. This symmetry is interrupted only by the need to spoil the sequence, which is accomplished by playing a dephasing gradient lobe 212. The $G_x$ and $G_y$ readout gradients, 206 and 208, respectively, are rewound by respective gradient pulses 214 and 216 to achieve steady state.

The readout gradient waveforms $G_x$, $G_y$, and $G_z$ are modulated during the scan to sample radial trajectories at different angles. The angular spacing of the radial trajectories is chosen such that a substantially uniform distribution of k-space sample points occurs at the peripheral boundary, $k_{max}$, of the sampled k-space sphere. Although several methods of calculating the distribution are known, an exemplary method that evenly distributes the projections by sampling the spherical surface with a spiral trajectory, having the conditions of constant path velocity and surface area coverage, may be used. This solution also has the benefit of generating a continuous sample path, which reduces gradient switching and eddy currents. For N total projections, the equations for the gradient amplitude as a function of projection number n are:

$$G_z = \frac{2n-1}{2N};$$ Eqn. (1)

$$G_x = \cos(\sqrt{2N\pi}\sin^{-1}(G_z(n)))\sqrt{1-G_z(n)^2}$$ Eqn. (2);

and $$G_y = \sin(\sqrt{2N\pi}\cos^{-1}(G_z(n)))\sqrt{1-G_z(n)^2}$$ Eqn. (3).

If a fully sampled image acquisition is to be performed, the total number of projections, N, is set to $N_p$, and a series of $N=N_p$ repetitions of the pulse sequence is performed. The readout gradient amplitudes for the $n^{th}$ repetition of the pulse sequence in this series is given by Eqns. (1)-(3). While n can be indexed from 1 to N in monotonic order during the scan, it can be appreciated that other orders are possible.

Referring still to FIG. 2, each acquired projection is motion sensitized by a bipolar motion encoding gradient $G_M$ 218. As is well known in the art, a velocity encoding gradient, $G_M$ 218, commonly includes two gradient lobes 220 and 222 of equal size and opposite polarity. The motion encoding gradient, $G_M$ 218, can be applied in any direction, and it is played out after transverse magnetization is produced by the RF excitation pulse 202 and before image data is acquired. The motion encoding gradient, $G_M$ 218, imposes a phase shift to the NMR signals produced by spins moving in the direction of the gradient, $G_M$ 218. The amount of this phase shift is determined by the velocity of the moving spins and the first moment of the motion encoding gradient, $G_M$ 218. The first moment, $M_1$, is equal to the product of the area under one of the gradient pulse lobes, 220 or 222, and the time interval, t, occurring between them. The first moment, $M_1$, is set to provide a significant phase shift, but not so large as to cause the phase to wrap around at high spin velocities.

To ensure that phase shifts in the acquired NMR signals 203 are due solely to spin motion, two acquisitions are commonly made at each projection angle and at each motion encoding gradient value, $M_1$. One image acquisition is performed with the bipolar gradient, $G_M$ 218, as shown in FIG. 2, and a second image acquisition is made with the polarity of each gradient lobe, 220 and 222, reversed. The two resulting phase images are then subtracted to null any phase shifts common to both acquisitions. The phase shifts caused by spin motion are also reinforced due to the reversal of the motion encoding gradient polarity. An alternative technique is to acquire signals with motion encoding along each axis and then a signal with no motion encoding. The resulting reference velocity image, $V_0$, may be subtracted from each of the motion encoded images ($V_x$, $V_y$, and $V_z$) to null any phase shifts not caused by spin motion. With this method there is no reinforcement of the phase shifts due to motion.

As indicated above, the motion encoding gradient, $G_M$ 218, can be applied in any direction. By way of example, the motion encoding gradient, $G_M$ 218, is applied separately along each of the gradient axes ($G_x$, $G_y$, and $G_z$) such that an image indicative of total spin velocity can be produced. That is, an image indicative of velocity along the z-axis, $V_z$, is produced from image data acquired with the bipolar motion encoding gradient, $G_M$ 218, added to the $G_z$ gradient waveform shown in FIG. 2; a second velocity image, $V_x$, is produced from image data acquired with the motion encoding gradient, $G_M$ 218, added to the $G_x$ gradient waveform; and a third velocity image, $V_y$, is produced from image data acquired with the motion encoding gradient, $G_M$ 218, added to the $G_y$ gradient waveform. An image indicative of the total spin velocity is then produced by combining the corresponding pixel values in the three velocity images according to:

$$V = \sqrt{V_x^2 + V_y^2 + V_z^2}$$ Eqn. (4).

By way of example, consider the acquisition of N individual image data sets from the same object under different magnetization preparation conditions, such as sensitization to different motion encoding directions, or varying environment conditions, such as temperature fluctuations. In the absence of relaxation effects, the MR signal acquired over a volume of interest ("VOI") is modeled as follows:

$$s_n(k) = \int_{VOI} \rho_n(r) e^{i\varphi_n(r)} e^{ik\cdot r} dr;$$ Eqn. (5)

where $s_n(k)$ is the signal acquired for the $n^{th}$ image data set; r and k are spatial and k-space coordinates, respectively; $f_n(r)$ is the magnitude component of an image reconstructed from the $n^{th}$ image data set; and $e^{i\varphi_n(r)}$ is the phase component of an image reconstructed from the $n^{th}$ image data set. It should be appreciated by those skilled in the art that the foregoing signal model can be readily adapted to acquisitions by RF coils with multiple receiver channels. For example, Eqn. (5) would be modified to include the sensitivity profile of the $\gamma^{th}$ receiver coil, $c_\gamma(r)$, as follows:

$$s_{\gamma,n}(k) = \int_{VOI} c_\gamma(r) \rho_n(r) e^{i\varphi_n(r)} e^{ik\cdot r} dr.$$ Eqn. (6)

If the assumption is made, and holds true, that the individual images share a substantially common image magnitude, it follows:

$$\rho \equiv \rho_n$$ Eqn. (7);

where n=1, ..., N, then Eqn. (5) is reduced to:

$$s_n(k) = E(\varphi_n, \rho)$$ Eqn. (8);

where:

$$E(\varphi_n, \rho) = \int_{VOI} \rho(r) e^{i\varphi_n(r)} e^{ik\cdot r} dr.$$ Eqn. (9)

This assumption allows the reconstruction of multiple images in one single procedure. For example, a single common magnitude image and a plurality of phase images are estimated by minimizing the following objective function:

$$\|s - E(\varphi_1, \ldots, \varphi_N, \rho)\|_2$$ Eqn. (10);

where s is a vector having the form:

$$s = \begin{bmatrix} s_1(k) \\ \vdots \\ s_N(k) \end{bmatrix}.$$

Eqn. (11)

Eqn. (10) can be rewritten more generally as:

$$\|s-E(x)\|_2$$

Eqn. (12);

where the vector x contains the L parameters in a signal model that can be represented by images. In the present example, x contains one element for the common image magnitude and N elements for the N image phases. However, as will be described below in detail, x can also contain common image magnitudes for two distinct chemical species, images phases for two distinct chemical species, $B_0$ field inhomogeneity information, and velocity image information.

The generalized objective function in Eqn. (12) is minimized, for example, using a Newton-Raphson method with line search. On each step, an updated direction is found by solving a set of liberalized linear equations, and the optimized step in the direction is taken through a line search procedure.

The signal model in Eqn. (9) is expanded using a Taylor series expansion about an estimate of the parameter vector, $\hat{x}$, as:

$$E(x)=E(\hat{x})+J\Delta x+$$

Eqn. (13);

where the higher order terms are neglected, $\Delta x=x-\hat{x}$, and J is a Jacobian matrix having the form:

$$J = \begin{bmatrix} E_1'(\hat{x}) \\ \vdots \\ E_N'(\hat{x}) \end{bmatrix}.$$

Eqn. (14)

where:

$$E_n'(x) = \begin{bmatrix} \frac{\partial E_n(x)}{\partial x_1} & \cdots & \frac{\partial E_n(x)}{\partial x_L} \end{bmatrix}.$$

Eqn. (15)

Here, the parameter vector, x, is differentiated with respect to each of the L parameters contained in the vector. Setting Eqn. (13) equal to the acquired data, s, the following set of linear equations is established:

$$g=J\Delta x$$

Eqn. (16);

where:

$$g=s-E(x)$$

Figure 3:
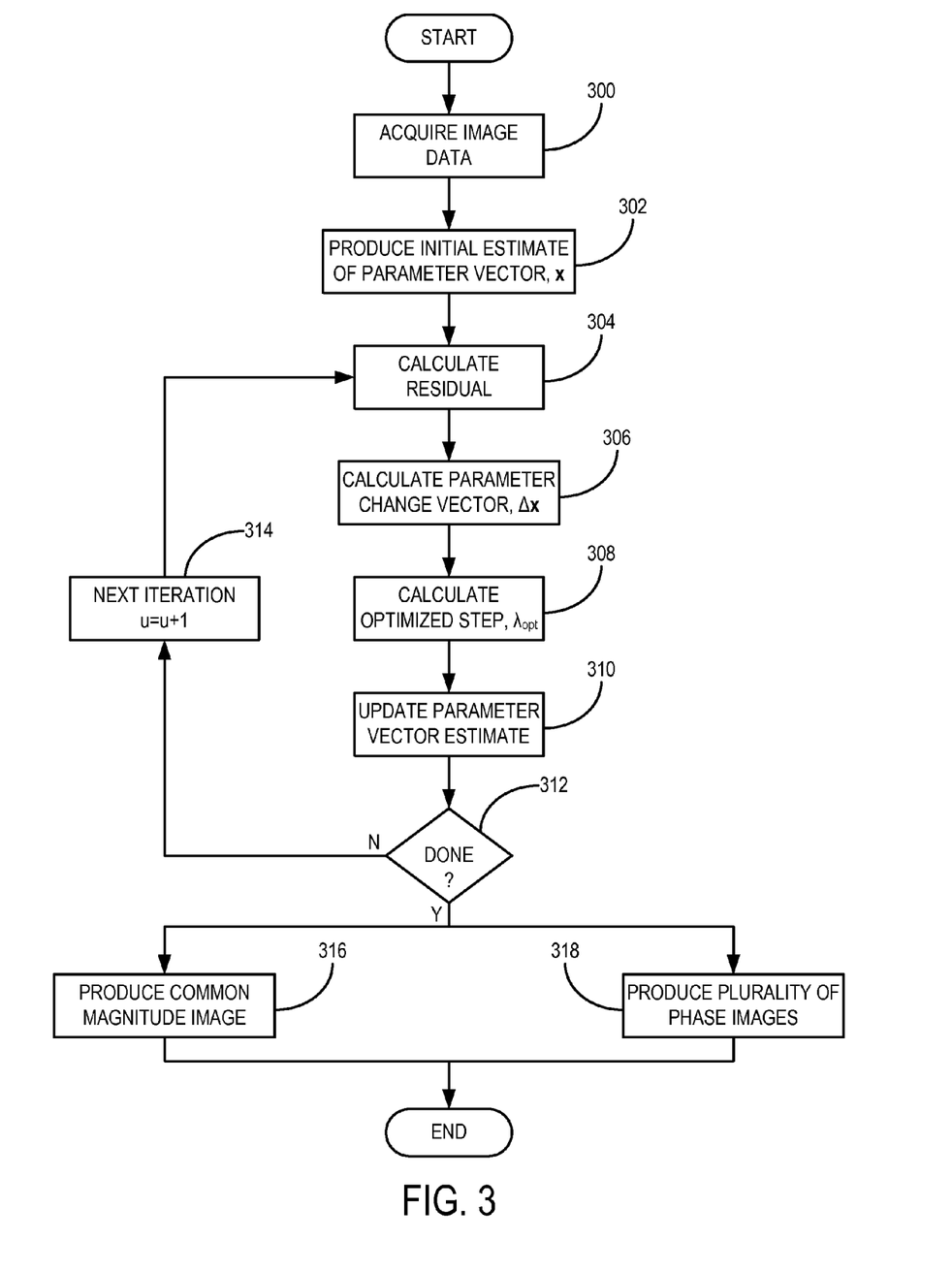
FIG. 3 is a flowchart setting forth the steps of an exemplary method for magnitude constrained phase contrast MRI in accordance with the present invention.

Eqn. (17);

Referring now to FIG. 3, the steps for an exemplary method of magnitude constrained phase contrast MRI in accordance with the present invention are illustrated. First, image data is acquired, as indicated at step 300. This data is acquired by directing the MRI system to perform, for example, a three-dimensional phase contrast enhanced pulse sequence, such as one of those described above and illustrated in FIG. 2 and as will be described with respect to FIG. 4. A common magnitude image and a plurality of phase images are subsequently reconstructed in the manner described above. More particularly, an initial estimate of the parameter vector, $x_0$, is first produced, as indicated at step 302. Using this initial estimate, a residual is calculated in accordance with Eqn. (17), as indicated at step 304. The residual for the $u^{th}$ iteration has the form:

$$g_{u-1}=s-E(x_{u-1})$$

Eqn. (18).

A parameter change vector, $\Delta x$, of the linear system of equations in Eqn. (16) is calculated next, as indicated at step 306. The system of equations for the $u^{th}$ iteration has the form:

$$g_{u-1}=J_{u-1}\Delta x$$

Eqn. (19);

where the $u^{th}$ iteration of the Jacobian matrix, $J_{u-1}$, has the form:

$$J_{u-1} = \begin{bmatrix} E_1'(x_{u-1}) \\ \vdots \\ E_N'(x_{u-1}) \end{bmatrix}.$$

Eq. (20)

After calculating the parameter change vector, $\Delta x$, which is treated as a search direction, an optimized step, $\lambda_{opt}$, is calculated along that direction, as indicated at step 308. This is achieved, for example, by minimizing the following objective function:

$$\|s-E(x_{u-1}+\lambda\Delta x)\|_2$$

Eqn. (21).

For example, the norm in Eqn. (21) is evaluated at discrete values of the step size, $\lambda$, such as 0, 0.5, and . A polynomial interpolation is then applied to find the optimized step, $\lambda_{opt}$, for example using a quadratic fit for a three point search. The estimated parameter vector is then updated for the next iteration, as indicated at step 310. This is achieved as follows:

$$x_u=x_{u-1}+\lambda_{opt}\Delta x$$

Eqn. (22).

The estimated parameter vector is then evaluated to determine whether a satisfactory solution has been reached, as indicated at decision block 312. If a satisfactory solution has not been reached, the iteration index, u, is updated, as indicated at step 314, and steps performed 304-310 are repeated. If a satisfactory solution has been achieved, then a common magnitude image, $\rho$, and a plurality of phase images, ($\phi_1, \ldots, \phi_N$), are produced from the estimated parameter vector, x, as indicated at steps 316 and 318, respectively. In this manner, the common magnitude image and the plurality of phase images are reconstructed substantially simultaneously using the sets of acquired image data since the images are produced from the estimated parameter vector.

It will be appreciated to those of ordinary skill in the art that the foregoing image reconstruction method is readily applicable to applications where images other than a plurality of phase images are desired to be produced. An exemplary application is phase contrast velocimetry, in which images indicative of flow velocity are produced directly from the parameter vector. As will be described below in detail, by making the appropriate changes to the signal model and parameter vector, this is readily applicable.

Iterative non-linear fat-water separation techniques, such as IDEAL, have previously been shown to be insensitive to inhomogeneous $B_0$ fields. The IDEAL method assumes that the acquired signal at any given voxel can be described by:

$$s_n=(\rho_F e^{i(\phi_F+2\pi\Delta f n)}+\rho_W e^{i\phi_W})e^{i\Psi t_n}$$

Eqn. (23);

where $s_n$ is the measured signal; n is the measurement number; $\rho_F$ and $\rho_W$ are the signal intensity of fat and water, respectively; $\phi_F$ and $\phi_W$ are the phases of fat and water, respectively; $t_n$ is the echo time at the $n^{th}$ measurement; $\Delta$ is the fat chemical shift with respect to water; and $\Psi$ is the off-resonance from $B_0$ inhomogeneity. By applying the principles from IDEAL to phase contrast imaging, three images at different echo times should be obtained for each motion encoding direction, since the water phase offset is assumed to be constant at each echo time ("TE"). Such a direct approach is unfeasible, however, since it results in a tripling of the scan time required for a standard phase contrast study. In order to reduce the number of required measurement points, the phase evolution from the motion encoding direction is incorporated into the signal model as an additional phase term:

$$s_n = (\rho_F e^{i(\phi_F + 2\pi \Delta f t_n + \gamma M_n \cdot V_F)} + \rho_W e^{i(\phi_W + \gamma M_n \cdot V_W)}) e^{i\Psi t_n} \quad \text{Eqn. (24);}$$

where $M_n$ is the first moment of the gradients at the $n^{th}$ measurement, $V_F$ is a velocity vector of fat, and $V_W$ is a velocity vector of water. This signal model assumes that the signal magnitude of fat and water are not affected by the motion encoding. This assumption holds if the diffusion and dephasing effects of each motion encoding are similar. To ensure that this is true, motion encoding is performed using balanced encoding schemes, in which the first moment magnitude is the same for all encodings. The signal model in Eqn. (24) can be further simplified by assuming fat to be static, thereby reducing the model to:

$$s_n = (\rho_F e^{i(\phi_F + 2\pi \Delta f t_n)} + \rho_W e^{i(\phi_W + \gamma M_n \cdot V_W)}) e^{i\Psi t_n} \quad \text{Eqn. (25);}$$

This assumption requires the phase of fat to be independent of the motion encoding, which is generally not true for the raw data due to phase offsets from eddy-currents and concomitant gradient errors. Thus, phase corrections for these offsets are incorporated into the reconstruction or performed before any signal fitting is performed. It is noted that Eqn. (25) has only 8 scalar unknowns for 3D motion encoding (6 phase and 2 magnitude), thereby reducing the number of required complex measurements to 6. This number of measurements represents a two-fold reduction compared to previous IDEAL phase contrast methods, which require 12 complex measurements.

Using the foregoing signal model, the method for estimating a parameter vector, x, described above with respect to FIG. 3 is modified as follows. First, the parameter vector itself has the form:

$$x = [\rho_W \quad \rho_F \quad \varphi_W \quad \varphi_F \quad \psi \quad v_x \quad v_y \quad v_z]; \quad \text{Eqn. (26)}$$

where $v_x$, $v_y$, and $v_z$ are the components of the velocity vector of water, $V_W$, along the x-, y-, and z-axes, respectively. Thus, the term, E(x), in Eqn. (12) would be equated to the signal model in Eqn. (25), where now the assumption is that the water and fat phase images; field map, $\Psi$; and velocity images substantially share a common water and fat image magnitude, $\rho_W$ and $\rho_F$, respectively.

In chemical shift imaging ("CSI") methods, several datasets each with a unique echo shift (and hence, image phase progression) are acquired in order to allow the subsequent estimation of complex fat and water images, and a $B_0$ field map. Moreover, for phase contrast imaging methods, the image data is acquired using a fixed echo time between acquisitions, with a bipolar encoding gradient applied before each acquisition to provide velocity encoding in a given direction. For the herein-described method for phase contrast velocimetry, these data acquisition strategies are combined. Additionally, each data set is acquired in a manner such that each has the same off-resonance and velocity artifacts, such as blurring artifacts, displacement artifacts, and dephasing effects. The task of making the data sets consistent in such a way requires that the trajectories of each dataset be similar in k–t space; that is, over a period of time, with only a constant difference in the time of acquisition between any two data sets. With a properly designed non-Cartesian sampling trajectory, two echoes can be collected per repetition time ("TR") period. This requires that both echoes have similar phase evolution from velocity and off-resonance across any given line in k-space. To implement a time efficient multi-echo readout following the design criteria introduced above, for example, the pulse sequence illustrated in FIG. 2 is modified to employ a dual-echo radial acquisition. One repetition of such a modified pulse sequence is illustrated in FIG. 4.

Figure 4:
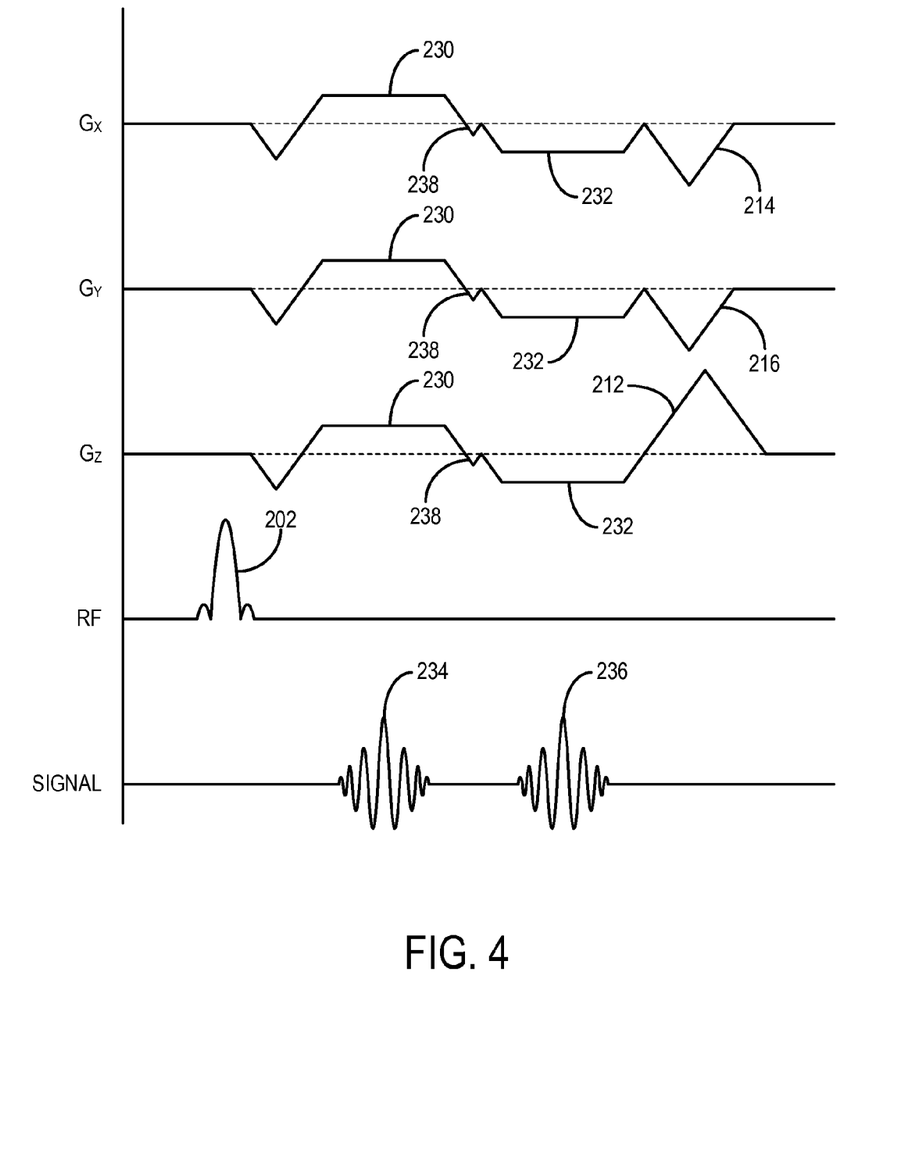
FIG. 4 is a graphic representation of one repetition of another exemplary pulse sequence employed by the MRI system of FIG. 1 when practicing the present invention.

Referring now to FIG. 4, a bipolar readout gradient includes a first bipolar motion encoding lobe 230 and a second bipolar motion encoding lobe 232. This first lobe 230 produces a first echo 234 at a first echo time, $TE_1$, and the second lobe 232 produces a second lobe 236 at a second echo time, $TE_2$. Furthermore, the readout gradient includes a small encoding gradient lobe 238 in order to sample different k-space lines within a single TR period, and to thereby avoid different off-resonance precession in the radial projections. Projections are repeated in the next TR so that each repeated line in k-space has both the same $1^{st}$ moment offset at each echo time and a constant time difference as a function of k-space in order to avoid inconsistencies due to off-resonance effects. In this fashion, both sets of echoes have similar artifacts from $1^{st}$ moment offsets, $T^*_2$ decay, and off-resonance. Both the first and second echoes, 234 and 236, are assumed to have the same, constant $1^{st}$ moment, which is set by the motion encoding bipolar gradient.

Since each of the two echoes, 234 and 236, in a given TR have similar motion encoding, at least four motion encodings must be performed to determine three velocity directions. Time encoding can also be incorporated into the pulse sequence using principles of echo shifting known to those skilled in the art. For example, eight distinct echoes are collected with times spaced evenly from a 0 to $2\pi$ phase shift of fat. Motion encoding is performed with balanced 4-point encoding to reduce magnitude differences between data sets. This scheme is readily incorporated into both 2D and 3D radial trajectories.

Figure 5:
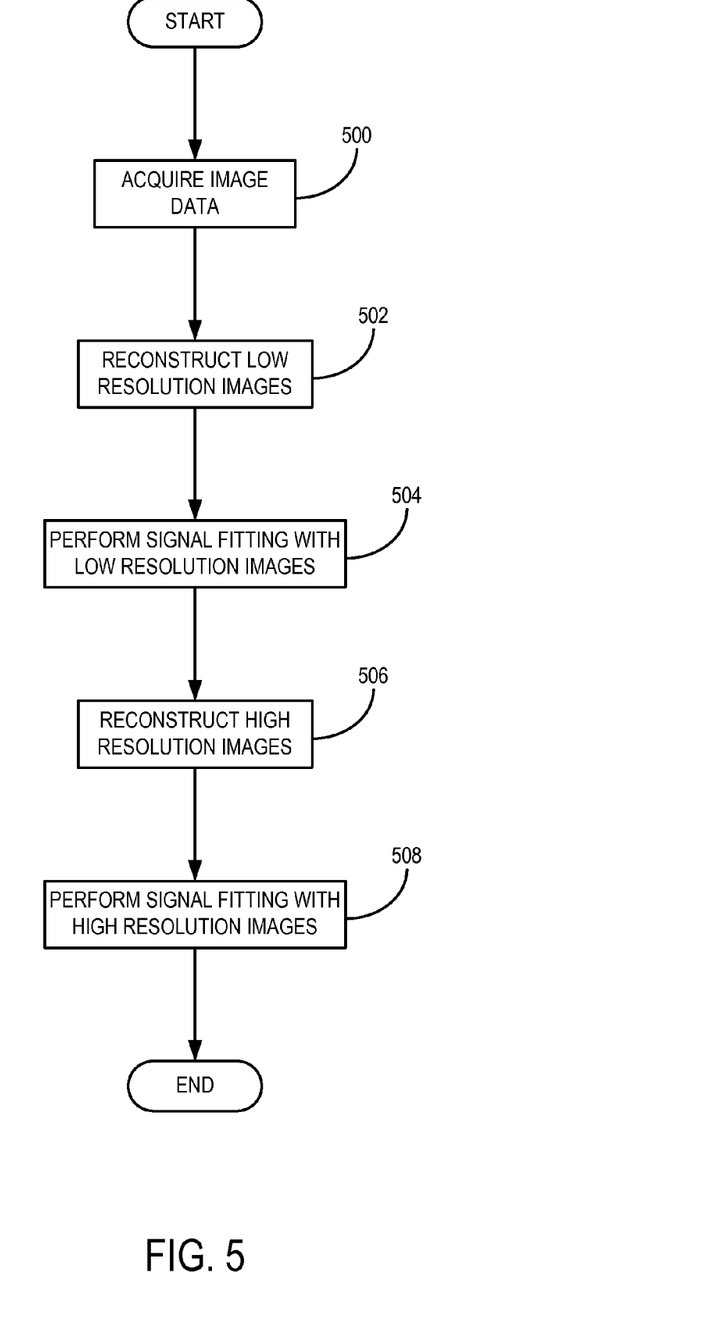
FIG. 5 is a flowchart setting forth the steps of an exemplary method for magnitude constrained phase contrast velocimetry, in accordance with the present invention.

Referring now to FIG. 5, the steps for an exemplary method of phase contrast velocimetry in accordance with the present invention are illustrated. The method begins with the acquisition of the requite image data, as indicated at step 500. Exemplary pulse sequences used to acquire the requisite image data include those described above with respect to FIGS. 2 and 4. Reconstruction of images subject to the combined fat-water signal model in Eqn. (25) can be done directly from the acquired k-space data to allow for more optimal utilization of the signal model; however, the scale of this non-linear inverse problem is prohibitively large for practical reconstruction. Therefore, in order to simplify the reconstruction, k-space data inversion and non-linear signal fitting is performed in separate stages.

To this end, low resolution, complex images are first reconstructed from the substantially fully sampled central portion of k-space using standard Fourier transform or gridding operations, as indicated at step 502. It will be appreciated by those skilled in the art that the term "low resolution" relates to reconstructing an image from substantially only the central portion of k-space, in which low spatial frequency information is contained. Then, the low resolution images are fitted to the signal model in Eqn. (25) on a per coil basis, as indicated at step 504. This signal fitting is performed, for example, using a regularized Newton-Raphson non-linear least squares method, such as the one described above with respect to FIG.

3. Regularization is introduced to help mitigate the poor determination of velocities when the water signal is small relative to the fat signal. The signal fitting produces low resolution estimate images of all of the signal model parameters. In multi-coil cases, individual low resolution off-resonance images are combined using standard multi-coil image combination methods.

Next, high resolution complex images that are substantially free from $B_0$ inhomogeneity effects are reconstructed, as indicated at step 506. This is achieved, for example, using a multi-frequency reconstruction of all k-space data using the low resolution field map estimate produced in step 504. Exemplary methods for performing multi-frequency reconstruction are described, for example, by L. C. Man, et al., in "Multifrequency Interpolation for Fast Off-resonance Correction," *Magn. Reson. Med.*, 1997; 37(5):785-792. The remaining low resolution parameters produced in step 504 are used as initial values in the subsequent high resolution fitting procedure. It should be appreciated by those skilled in the art that, with single echo Cartesian sampling, the multi-frequency reconstruction can be replaced with simple image based demodulation to save computation time. The reconstructed high resolution images are then fitted to the signal model in Eqn. (25) in order to produce high resolution estimate images of the signal model parameters, as indicated at step 508. Since the high resolution images are demodulated with the low resolution field map estimate, they can be fitted to the signal model without the $B_0$ inhomogeneity term, $e^{i\psi t_n}$. Again, multi-coil images can be recombined in the usual fashion.

Thus, a method for magnitude constrained phase contrast MRI has been presented. This method is applicable not only to the reconstruction of a plurality of phase images that share a substantially common image magnitude, but also to more complex methods for phase contrast velocimetry, in which multiple velocity images that share a substantially common image magnitude are produced. Additionally, a method for simultaneous phase contrast velocimetry and chemical shift imaging, in which water and fat signal separation is provided, has been presented.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for performing phase contrast magnetic resonance imaging (MRI) of a subject with an MRI system, the steps comprising:
    a) directing the MRI system to perform a phase sensitive pulse sequence in order to acquire phase contrast enhanced image data from the subject;
    b) reconstructing a set of images of the subject from the acquired image data by:
        b)i) estimating a common magnitude image from the acquired phase contrast enhanced image data; and
        b)ii) estimating, substantially contemporaneously with step b)i), a plurality of phase images from the acquired phase contrast enhanced image data.

2. The method as recited in claim 1 in which the acquired phase contrast image data is undersampled phase contrast image data acquired by at least one of undersampling of k-space and partial sampling of k-space.

3. The method as recited in claim 2 in which the acquired phase contrast image data is acquired with a three-dimensional radial projection sampling pattern that is angularly undersampled.

4. The method as recited in claim 1 in which step b) includes fitting the acquired phase contrast enhanced image data to a signal model.

5. The method as recited in claim 4 in which the signal model in step b) includes a magnitude term and a phase term for each of the plurality of phase images.

6. The method as recited in claim 4 in which step b) further includes:
    b)iii) estimating, substantially contemporaneously with steps b)i) and b)ii), a plurality of velocity images from the acquired phase contrast enhanced image data.

7. The method as recited in claim 6 in which the signal model in step b) includes a water magnitude term; a fat magnitude term; a water phase term; a fat phase term; a magnetic field inhomogeneity term; and a velocity vector term.

8. The method as recited in claim 1 in which step b) includes reconstructing a low resolution image of the subject from the acquired phase contrast enhanced image data and fitting the reconstructed low resolution image to a signal model in order to produce a field map.

9. A method for performing phase contrast velocimetry on a subject with a magnetic resonance imaging (MRI) system, the steps comprising:
    a) directing the MRI system to perform a pulse sequence that applies a motion encoding gradient along a motion encoding axis in order to acquire a phase contrast image data set from the subject;
    b) reconstructing a low resolution image from the acquired phase contrast image data set;
    c) fitting the reconstructed low resolution image to a signal model in order to produce a field map;
    d) reconstructing an image of the subject from the acquired phase contrast image data set and using the produced field map; and
    e) fitting the reconstructed image to another signal model in order to produce a velocity image of the subject that is indicative of velocity along the motion encoding axis.

10. The method as recited in claim 9 in which step a) is repeated in order to acquire a plurality of phase contrast image data sets, the orientation of the motion encoding axis being changed during each repetition of step a).

11. The method as recited in claim 10 in which an echo time at which image data is acquired is shifted from one repetition of step a) to the next.

12. The method as recited in claim 10 in which image data is acquired from two echoes during each repetition of step a) and an echo time of each of the two echoes is shifted from one repetition of step a) to the next.

13. The method as recited in claim 12 in which the two echoes are formed while applying the motion encoding gradient along the motion encoding axis such that each echo is sensitive to phase shifts in opposite directions along the motion encoding axis.

14. The method as recited in claim 10 in which step d) includes estimating a common image magnitude for the plurality of acquired phase contrast image data sets.

15. The method as recited in claim 14 in which step e) further includes producing a velocity image for each of the plurality of acquired phase contrast image data sets, each velocity image being indicative of a velocity along the motion encoding axis associated with the respective acquired phase contrast image data set.

16. The method as recited in claim 14 in which step e) includes producing at least one of a water magnitude image, a water phase image, a fat magnitude image, and a fat phase image.

17. The method as recited in claim 9 in which the signal model in step c) includes a water magnitude term; a fat magnitude term; a water phase term; a fat phase term; a magnetic field inhomogeneity term; and a velocity vector term, and the another signal model in step e) includes a water magnitude term; a fat magnitude term; a water phase term; a fat phase term; and a velocity vector term.

* * * * *